United States Patent
Okuno et al.

(10) Patent No.: US 7,851,882 B2
(45) Date of Patent: *Dec. 14, 2010

(54) SILICON CARBIDE SEMICONDUCTOR DEVICE HAVING JUNCTION BARRIER SCHOTTKY DIODE

(75) Inventors: Eiichi Okuno, Mizuho (JP); Takeo Yamamoto, Nishikamo-gun (JP)

(73) Assignee: DENSO CORPORATION, Kariya (JP)

( * ) Notice: Subject to any disclaimer, the term of this patent is extended or adjusted under 35 U.S.C. 154(b) by 225 days.

This patent is subject to a terminal disclaimer.

(21) Appl. No.: 12/216,182

(22) Filed: Jul. 1, 2008

(65) Prior Publication Data

US 2009/0008651 A1 Jan. 8, 2009

(30) Foreign Application Priority Data

Jul. 5, 2007 (JP) .............................. 2007-177284

(51) Int. Cl.
*H01L 29/47* (2006.01)
(52) U.S. Cl. ................ 257/472; 257/E29.338
(58) Field of Classification Search ................ 257/77, 257/472, E29.104, E29.338
See application file for complete search history.

(56) References Cited

U.S. PATENT DOCUMENTS

| | | | |
|---|---|---|---|
| 4,641,174 A * | 2/1987 | Baliga | 257/264 |
| 5,017,976 A * | 5/1991 | Sugita | 257/494 |
| 5,371,400 A * | 12/1994 | Sakurai | 257/478 |
| 6,524,900 B2 * | 2/2003 | Dahlqvist et al. | 438/167 |
| 6,936,850 B2 * | 8/2005 | Friedrichs et al. | 257/77 |
| 6,979,863 B2 * | 12/2005 | Ryu | 257/335 |
| 7,034,376 B2 * | 4/2006 | Okada et al. | 257/471 |
| 7,071,525 B2 * | 7/2006 | Chiola et al. | 257/471 |
| 7,397,102 B2 * | 7/2008 | Hshieh et al. | 257/471 |
| 7,615,839 B2 * | 11/2009 | Souma et al. | 257/473 |
| 2002/0125541 A1 * | 9/2002 | Korec et al. | 257/471 |
| 2006/0255423 A1 * | 11/2006 | Ryu et al. | 257/485 |
| 2008/0169475 A1 * | 7/2008 | Nishio et al. | 257/77 |
| 2008/0258153 A1 * | 10/2008 | Yamamoto et al. | 257/77 |
| 2008/0277668 A1 * | 11/2008 | Okuno et al. | 257/77 |

FOREIGN PATENT DOCUMENTS

JP    A-2000-252478    9/2000

* cited by examiner

*Primary Examiner*—Lex Malsawma
(74) *Attorney, Agent, or Firm*—Posz Law Group, PLC

(57) ABSTRACT

A silicon carbide semiconductor device includes a drift layer having first conductive type on a substrate, a cell region in the drift layer, a schottky electrode on the drift layer and multiple second conductive type layers in the cell region. The second conductive type layers are separated from each other and contact the schottky electrode. A size and an impurity concentration of the second conductive type layers and a size and an impurity concentration of a portion of the drift layer sandwiched between the second conductive type layers are determined so that a charge quantity of the second conductive type layers is equal to a charge quantity of the portion. Hereby, the pressure-proof JBS and low resistivity second conductive type layers arranged on a surface of the drift layer to provide a PN diode, can be obtained.

7 Claims, 10 Drawing Sheets

SILICON CARBIDE SEMICONDUCTOR DEVICE HAVING JUNCTION BARRIER SCHOTTKY DIODE

CROSS REFERENCE TO RELATED APPLICATION

This application is based on Japanese Patent Application No. 2007-177284 filed on Jul. 5, 2007, the disclosure of which is incorporated herein by reference.

FIELD OF THE INVENTION

The present invention relates to a silicon carbide semiconductor device having a junction barrier schottky diode comprising silicon carbide.

BACKGROUND OF THE INVENTION

A leakage current of a schottky barrier diode (hereinafter referred to as "SBD") when an opposite direction voltage is applied is larger than that of a PN diode, since in an interface between a schottky electrode and a semiconductor, the difference of work function between the electrode material, i.e., metal, and the semiconductor is small.

In order to decrease the leakage current, a constitution that a PN diode is formed in a part of a schottky junction and a leakage current when an opposite direction voltage is applied is suppressed is proposed, which is disclosed in JP-A-2000-252478. Specifically, a frame-shaped p-type resurf layer is arranged at a peripheral portion, which surrounds a region in which a schottky electrode and an n-type semiconductor layer are made to be a schottky contact, and high impurity concentration p-type semiconductor layer is arranged in a stripe manner or is sprinkled inside the resurf layer so that the p-type semiconductor layer is in contact with the schottky electrode.

In the junction barrier schottky diode (hereinafter referred to as "JBS") as shown in the above reference, the p-type semiconductor layer is formed based on a simulation for a pressure-proof design and width and distance of each of the p-type layers are controlled appropriately so that the pressure-proof JBS can be obtained. Therefore, it is difficult to obtain both the pressure-proof JBS and a low resistivity p-type layer, and the JBS of the above reference lacks versatility.

SUMMARY OF THE INVENTION

In view of the above-described problem, it is an object of the present disclosure to provide a silicon carbide (hereinafter referred to as "SiC") semiconductor device having a JBS, which can be accomplish both the pressure-proof JBS and a low resistivity semiconductor layer.

According to an aspect of the present disclosure, a silicon carbide semiconductor device having a junction barrier schottky diode includes a substrate made of first conductive type silicon carbide, the substrate having a main surface and a rear surface, a drift layer made of the first conductive type silicon carbide disposed on the main surface of the substrate, an impurity concentration of the drift-layer being lower than an impurity concentration of the substrate, wherein the drift layer includes a cell region, an insulating film having an opening portion disposed on the drift layer, the opening portion being disposed in the cell region, a plurality of second conductive type layers disposed in the cell region of the drift layer, and a schottky barrier diode having a schottky electrode and an ohmic electrode, the schottky electrode being disposed on the drift layer in the opening portion of the cell region and the ohmic electrode being disposed on the rear surface of the substrate. The schottky electrode and a surface of the drift layer provide a schottky contact. The plurality of second conductive type layers are separated from each other and contact the schottky electrode. The plurality of second conductive type layers and the drift layer provides a PN diode. A size and an impurity concentration of the plurality of second conductive type layers and a size and an impurity concentration of a portion of the drift layer sandwiched between the plurality of second conductive type layers are determined so that a charge quantity of the plurality of second conductive type layers is equal to a charge quantity of the portion.

In the above silicon carbide semiconductor device, the pressure-proof JBS and a plurality of low resistivity layers, which are arranged on the surface of the drift layer to provide the PN diode, can be obtained.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
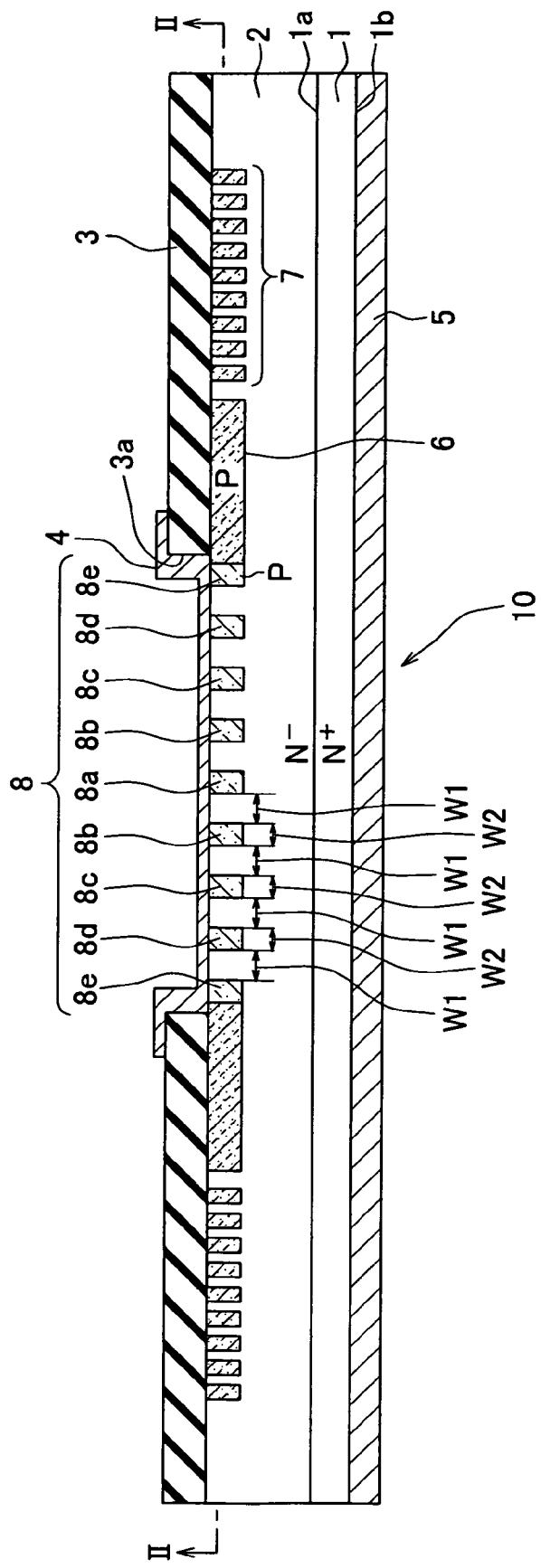
FIG. 1 is a cross sectional view showing a SiC semiconductor device having a JBS according to a first embodiment.

The first embodiment will be described. A cross sectional view of a SiC semiconductor device having a JBS according to the embodiment is shown in FIG. 1. A cross sectional view of the SiC semiconductor device taken along line II-II in FIG.

Figure 2:
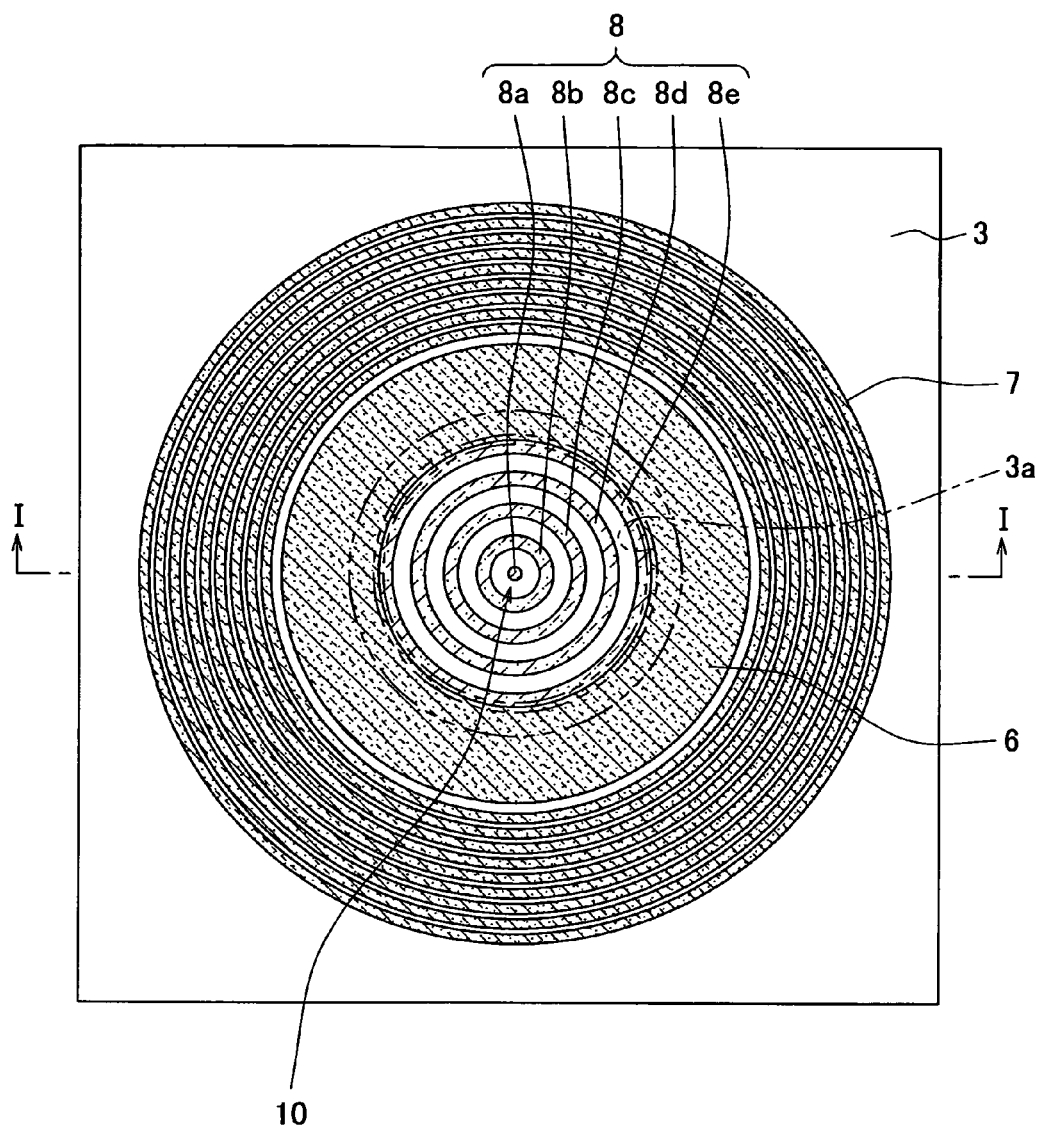
FIG. 2 is a cross sectional view showing the SiC semiconductor device taken along line II-II in FIG. 1.

1 is shown in FIG. 2. FIG. 1 is a cross sectional view taken along line I-I in FIG. 2. The SiC semiconductor device of the embodiment will be described with reference to these drawings.

As shown in FIG. 1, the SiC semiconductor device is formed by using an n$^+$-type substrate 1 made of SiC, which has an impurity concentration range of about $2\times10^{18}$ cm$^{-3}$ to $1\times10^{21}$ cm$^{-3}$. A top surface of the substrate 1 is regarded as a main surface 1a and a bottom surface, which is an opposite surface of the main surface 1a, is regarded as a rear surface 1b. An n$^-$-type drift layer 2 made of SiC is formed on the main surface 1a, the drift layer 2 has an impurity concentration lower than the substrate 1, for example, about $5\times10^{15}$ ($\pm50\%$) cm$^{-3}$, i.e., in a range between $2.5\times10^{15}$ cm$^{-3}$ and $7.5\times10^{15}$ cm$^{-3}$, specifically about $5\times10^{15}$ cm$^{-3}$. The SiC semiconductor device is composed of a SBD 10, which is formed in a cell region of the substrate 1 and the drift layer 2, and a termination structure (i.e., termination region), which is formed in a periphery region of the cell region.

Specifically, an insulating film 3 made from a silicon oxide film, in which an opening portion 3a is partially formed, is formed over the surface of the drift layer 2 in the cell region. A schottky electrode 4 made from Mo (molybdenum), Ni (nickel), Ti (titanium) or an alloy thereof or the like, is formed in the opening portion 3a so as to be in contact with the drift layer 2. The opening portion 3a is circular as shown in FIG. 2. The schottky electrode 4 and the drift layer 2 are made to be a schottky contact in the opening portion 3a. An ohmic electrode 5 made from Ni and Ti or the like is formed so as to be in contact with the rear surface 1b of the substrate 1. The SBD 10 is composed of these elements.

The termination region formed in the periphery region of the SBD 10 is as follows. In the both ends of the schottky electrode 4, a p-type resurf layer 6 is formed at a surface part of the drift layer 2 so as to be in contact with the schottky electrode 4. Furthermore, a plurality of p-type guard ring layers 7 is arranged so as to surround a periphery of the resurf layer 6. The resurf layer 6 includes an impurity such as Al (aluminum), and has an impurity concentration of about $5\times10^{16}$ cm$^{-3}$ to $1\times10^{18}$ cm$^{-3}$. The resurf layer 6 and the guard ring layers 7 are circular to surround the cell region as shown in FIG. 2. By arranging these elements, electric field in the periphery of the SBD 10 can be enlarged and the electric field concentration can be prevented so that the pressure-proof property can be improved.

Further, a p-type semiconductor layer 8 is arranged on an inner side from an end portion of the resurf layer 6, which is arranged at the cell region side of the termination region, so as to be in contact with the schottky electrode 4 so that the JBS in which the PN diode composed of the layer 8 and the drift layer 2 is formed. As shown in FIG. 2, the layer 8 is circular along an outer edge of the cell region (an outer edge of the schottky electrode 4). A circular center portion 8a is arranged in the center of a region in contact with the drift layer 2 of the schottky electrode 4. A plurality of circular portions 8b to 8e (four portions in the embodiment) are arranged concentrically with the center portion 8a as the center. Moreover, the circular portion 8e, which is arranged in the outermost of the circular portions 8b to 8e, is arranged so as to be in contact with the end portion of the inner side of the resurf layer 6 or so as to locate inside the resurf layer 6. The inner circular portions 8b to 8d, which are arranged between the center portion 8a and the outermost circular portion 8e, are symmetrically arranged in the cross sectional view taken along the radial direction with the center portion 8a as the center. In such the constitution, each of the layers 8a to 8e is located so that a distance W1 between two adjacent layers 8a to 8e and a width W2 of each of the layers 8a to 8e are the same value.

Each of the layers 8a to 8e and regions which are surrounded by each of the layers 8a to 8e are formed so as to have same charge quantity, that is, the charge quantity of each of the layers 8a to 8e (hole charge amount) is same as the charge quantity of the regions (electron charge amount). An impurity concentration of each of the layers 8a to 8e is higher than that of the drift layer 2 so that the regions which are surrounded by each of the layers 8a to 8e are completely-depleted by the depletion layer extending toward the drift layer 2 from each of the layers 8a to 8e in off-state. The width W2 of each of the layers 8a to 8e and the impurity concentration contributes to an on-state resistance. The narrower the width W2 and the lower the impurity concentration of each of the layers 8a to 8e, the on-state resistance can be lower. Therefore, the width W2 is narrower than the distance W1.

For example, when the impurity concentration of the drift layer 2 is about $5\times10^{15}$ ($\pm50\%$) cm$^{-3}$ as stated above, the impurity concentration of each of layers 8a to 8e is about $5\times10^{17}$ cm$^{-3}$ to $1\times10^{20}$ cm$^{-3}$. The distance W1 is $2.0\pm0.5$ μm and the width W2 is $1.5\pm0.5$ μm. In this embodiment, the ratio between W2 and W1 is 1.5/2.0, for example.

In the SiC semiconductor device having the above-mentioned JBS, when a voltage exceeding the schottky barrier is applied to the schottky electrode 4 with the schottky electrode 4 as an anode and the ohmic electrode 5 as a cathode, a current flows between the schottky electrode 4 and the ohmic electrode 5.

On the other hand, in the off state, the regions which are surrounded by each of the layers 8a to 8e are completely-depleted by the depletion layer extending toward the drift layer 2 from each of the layers 8a to 8e, which are arranged under the schottky electrode 4. Thus, it become possible to decrease the leakage current when an opposite direction voltage is applied.

Next, the manufacturing steps of the SiC semiconductor device will be described. FIGS. 3A to 3E are cross sectional views showing the manufacturing steps of the SiC semiconductor device of FIG. 1. It is noted that the p-type guard ring layers 7 are not shown in FIGS. 3A to 3E to simplify the drawings.

Figure 3A:
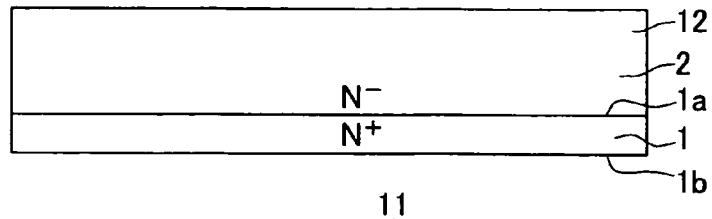
FIGS. 3A to 3E are cross sectional views showing manufacturing steps of the SiC semiconductor device in FIG. 1.

Firstly, in the step of FIG. 3A, the n$^-$-type drift layer 2 is formed over the main surface 1a of the n$^+$-type substrate 1 by an epitaxial growth. Subsequently, in the step of FIG. 3B, a mask 11 made from an LTO (low-temperature oxide) or the like is formed over the drift layer 2, and then, regions of the mask 11 located over the portions, in which the p-type resurf layer 6 and the p-type guard ring layers 7 are formed afterward, are etched by the photolithography etching. P-type impurity such as Al is doped by the ion implantation with the etched mask 11, and then the thermal treatment for the activation is performed to form the resurf layer 6 and the guard ring layers 7.

Figure 3B:
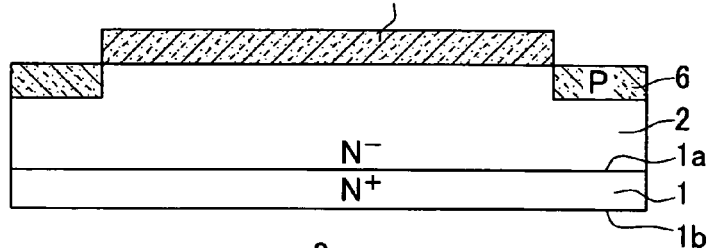
Figure 3C:
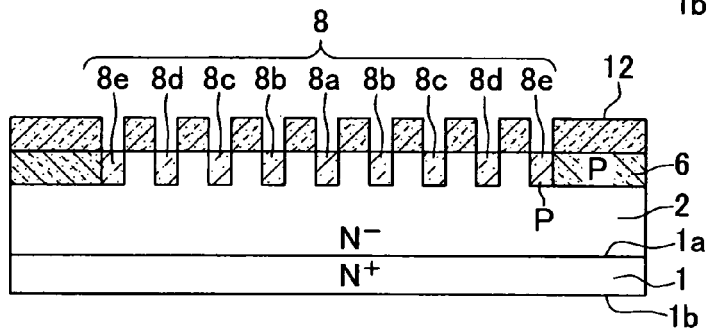

In the step of FIG. 3C, after removing the mask 11, a mask 12 made from an LTO or the like is formed, and then, regions of the mask 12 located over the portions, in which the layers 8a to 8e are formed afterward, are etched by the photolithography etching. P-type impurity such as Al is doped by the ion implantation with the etched mask 12, and then the thermal treatment for the activation is performed to form the layers 8a to 8e.

In the forming step of the layers 8a to 8e, the layers 8a to 8e are formed so that the charge quantity thereof becomes same as the charge quantity of regions surrounded by each of the layers 8a to 8e in the drift layer 2. That is, the charge quantity of each of the layers 8a to 8e (hole charge amount) and the charge quantity of the regions (electron charge amount) are set to be same value in advance, and then, the impurity concentration of each of the layers 8a to 8e and the distance W1 are determined so as to become equal to these charge quantities. These charge quantities are set in advance in this way, the impurity concentration of the layers 8a to 8e and the width W2 of each of the layers 8a to 8e are determined, and in addition, the distance W1 between two adjacent layers are determined based on the drift layer 2. Thus, the layers 8a to 8e can be designed easily.

It is noted that although the step of FIG. 3B and the step of FIG. 3C are shown as the independent steps, a step using only one mask may be performed. The regions of the mask located over the portions, in which the resurf layer 6, the guard ring layers 7 and each of the layers 8a to 8e are formed afterward, are removed, and the ion implantation for doping the p-type impurity and the activation are performed to form the resurf layer 6, the guard ring layers 7 and each of the layers 8a to 8e at the same time.

Figure 3D:
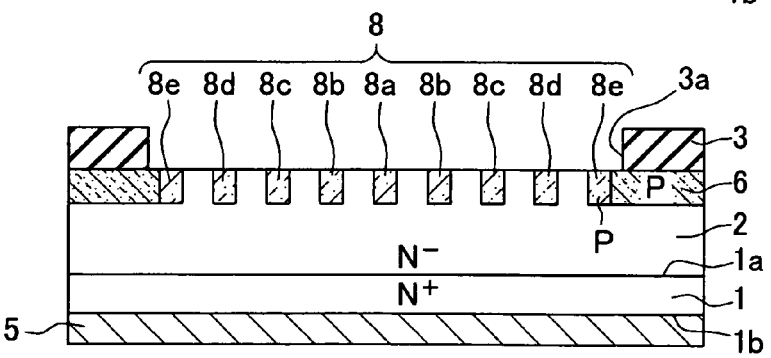

Subsequently, in the step of FIG. 3D, after removing the mask 12, the ohmic electrode 5 is formed by forming the metal layer made from Ni and Ti or the like on the rear surface 1b of the substrate 1. After that, the surface of the SiC is cleaned by the sacrificial oxidation, for example, a silicon oxide film is formed by the plasma CVD and the reflow process is performed to form the insulating film 3. The insulating film 3 is etched by the photolithography etching to form the opening portion 3a.

Figure 3E:
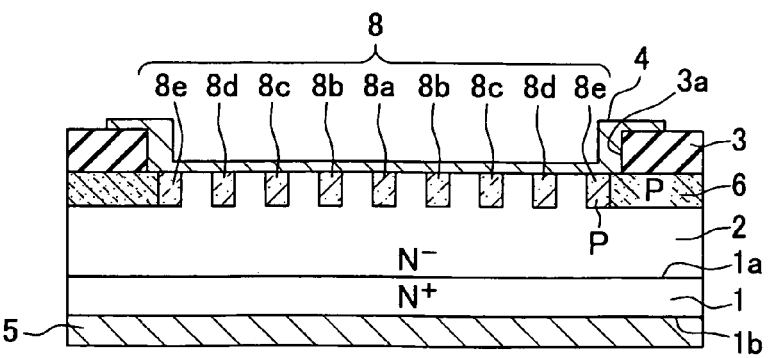

In the step of FIG. 3E, a metal layer made from Mo, Ni and Ti or the like over the insulating film 3 and the opening portion 3a, and the metal layer is patterned to form the schottky electrode 4. The SiC semiconductor device having the JBS shown in FIG. 1 is formed by performing these steps.

As mentioned above, the SiC semiconductor device of the embodiment is designed so that each of the layers 8a to 8e and regions which are surrounded by each of the layers 8a to 8e have same charge quantity, that is, the charge quantity of each of the layers 8a to 8e (hole charge amount) is same as the charge quantity of the regions (electron charge amount). Hereby, these elements can be designed easily and the effects mentioned below can be obtained. The effects will be described with reference to FIGS. 4 to 12.

Figure 4:
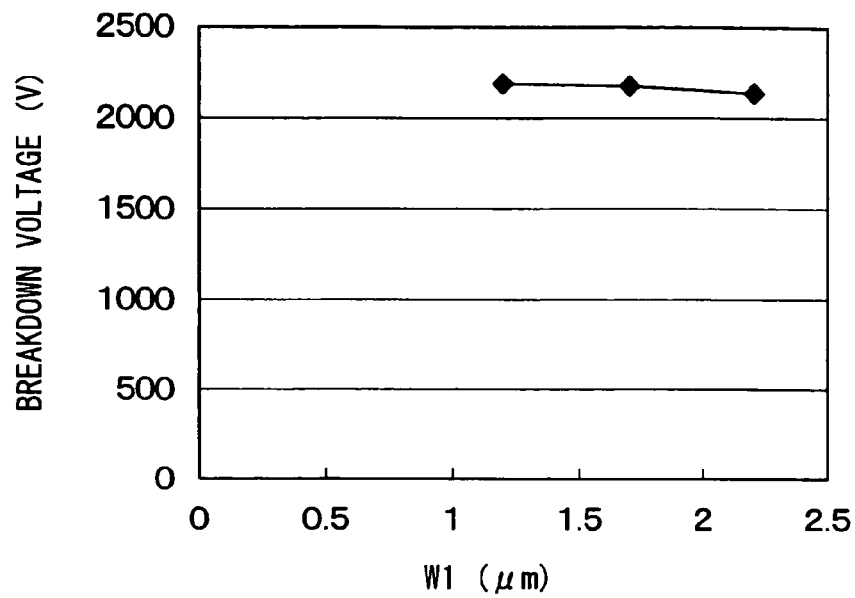
FIG. 4 is a graph showing a breakdown voltage change of the JBS with the change of a distance W1 between the p-type layers.
Figure 5:
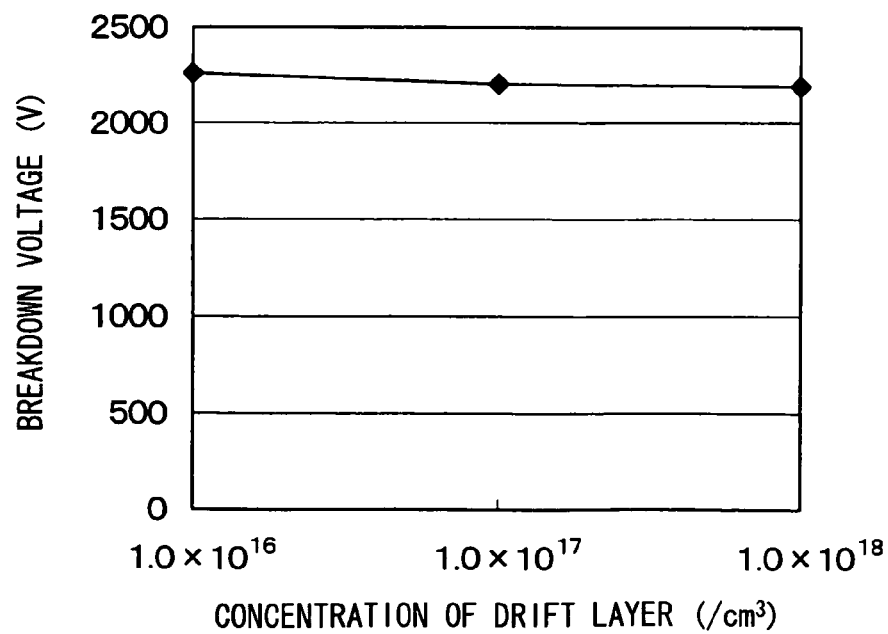
FIG. 5 is a graph showing a breakdown voltage change of the JBS with the change of an impurity concentration of an n$^-$-type drift layer.

FIG. 4 is a graph showing the breakdown voltage change of the JBS with the change of a distance W1 between two adjacent layers 8a to 8e. FIG. 5 is a graph showing the breakdown voltage change of the JBS with the change of an impurity concentration of the drift layer 2.

FIG. 4 and FIG. 5 show that the breakdown voltage does not change even when the distance W1 between two adjacent layers 8a to 8e is changed and when the impurity concentration of the drift layer 2 is changed. Therefore, when these elements are designed so that the charge quantities become equal, these elements becomes possible to be designed easily and the highly pressure-proof JBS can be obtained regardless of the distance W1 or the impurity concentration of the drift layer 2.

Figure 6:
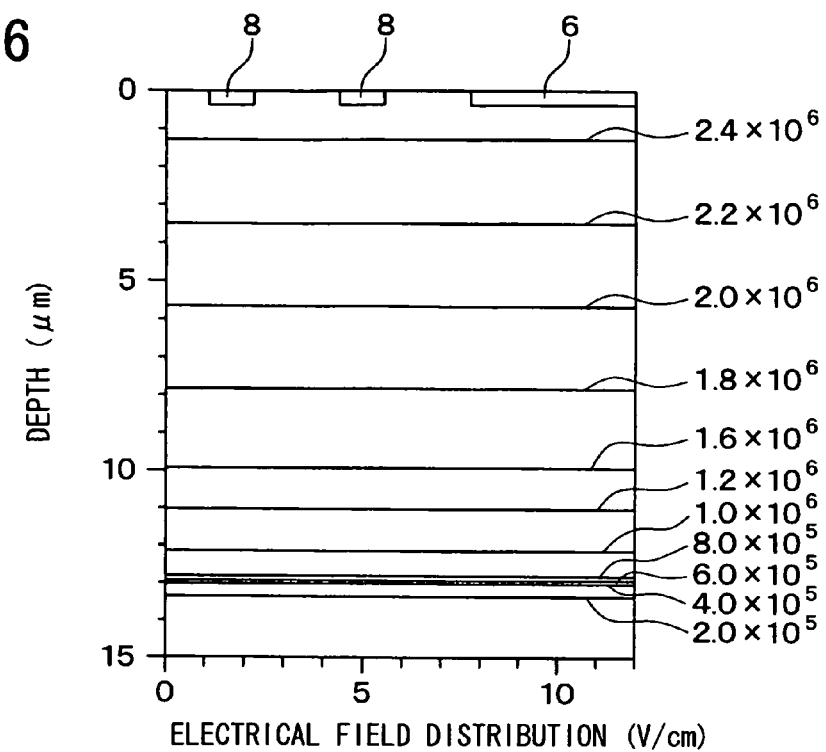
FIG. 6 is a view showing an electrical field distribution in the JBS according to a simulation model 1.
Figure 7:
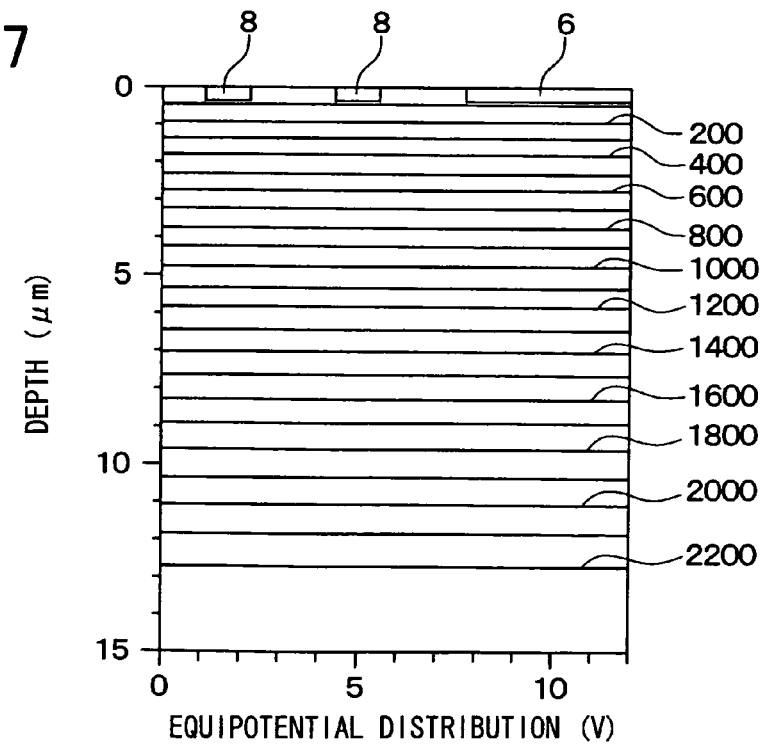
FIG. 7 is a view showing an equipotential distribution in the JBS according to the simulation model 1.
Figure 8:
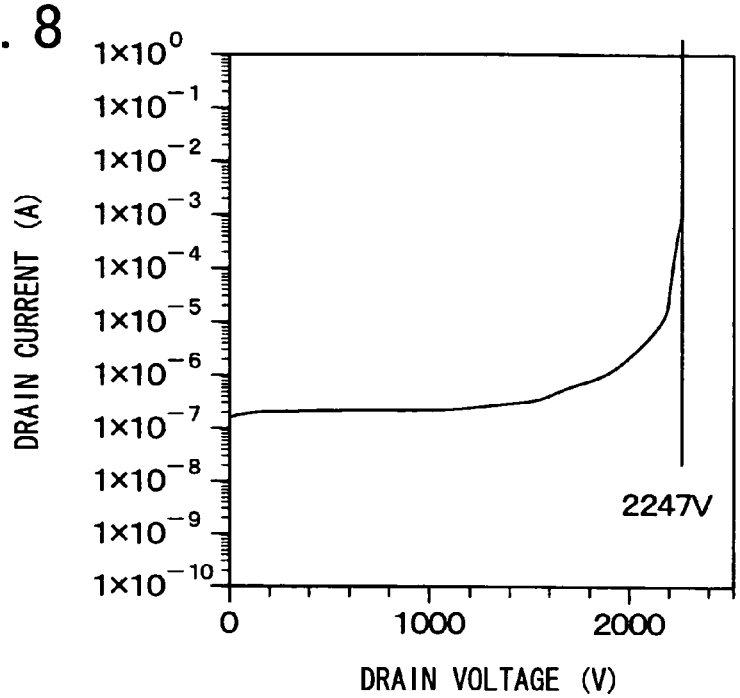
FIG. 8 is a view showing a drain voltage-drain current property in the JBS according to the simulation model 1.

In addition, a simulation model 1, in which the p-type impurity concentration of the layers 8a to 8e is set to $5 \times 10^{15}$ cm$^{-3}$ and the n-type impurity concentration of the drift layer 2 is set to $5 \times 10^{15}$ cm$^{-3}$, and a simulation model 2, in which the p-type impurity concentration of the layers 8a to 8e is set to $1 \times 10^{16}$ cm$^{-3}$ and the n-type impurity concentration of the drift layer 2 is set to $5 \times 10^{15}$ cm$^{-3}$ are assumed and an electrical field distribution, an equipotential distribution and a drain voltage-drain current property in the JBS are determined. FIGS. 6 to 8 show the results in the simulation model 1, and FIGS. 9 to 11 show the results in the simulation model 2.

Figure 9:
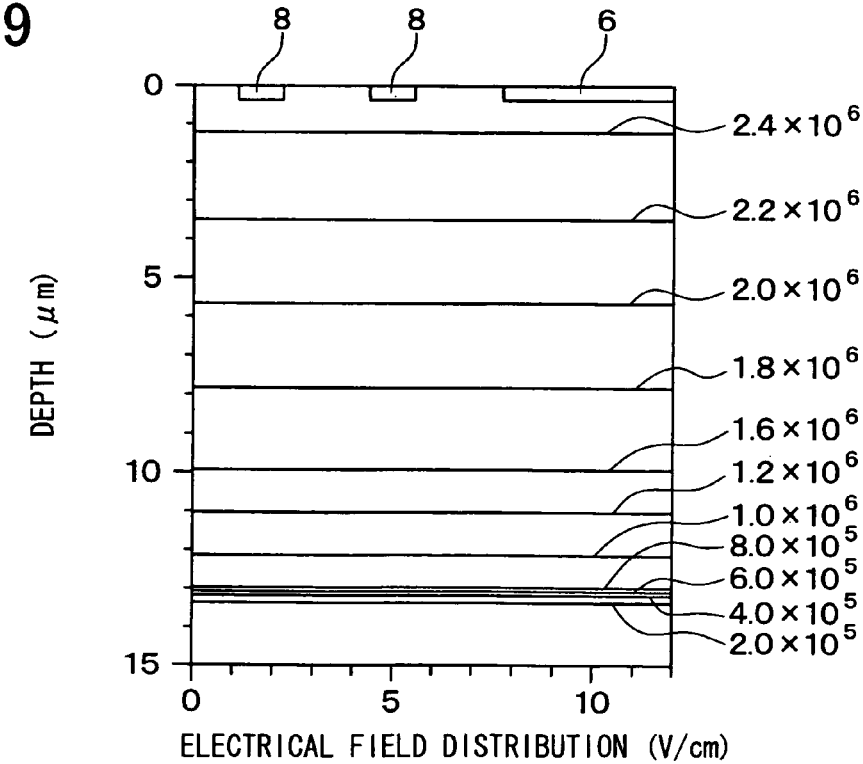
FIG. 9 is a view showing an electrical field distribution in the JBS according to a simulation model 2.
Figure 10:
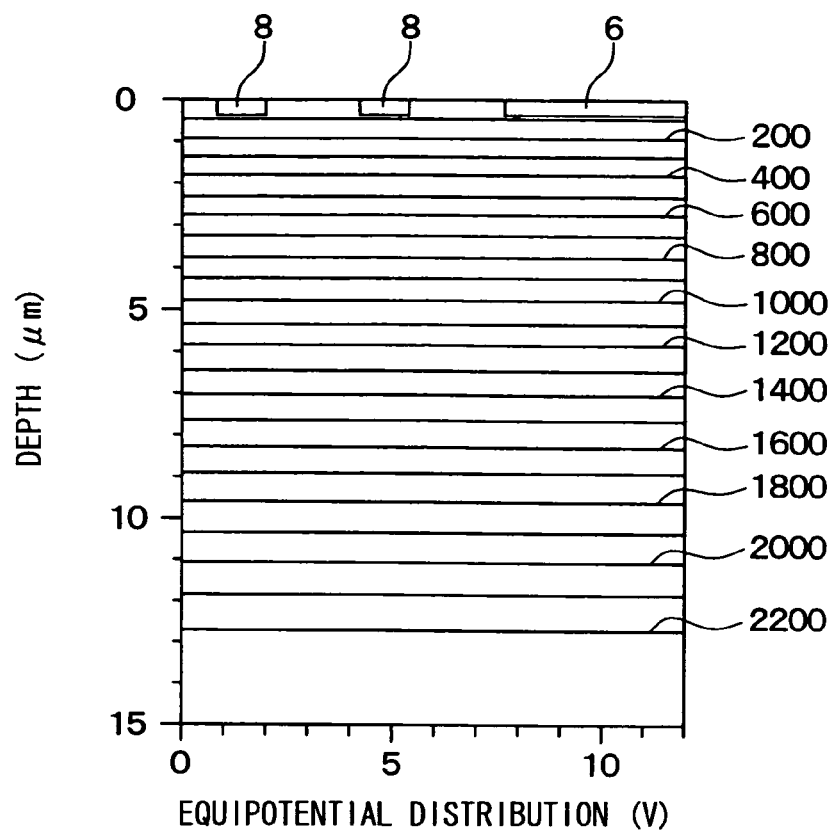
FIG. 10 is a view showing an equipotential distribution in the JBS according to the simulation model 2.
Figure 11:
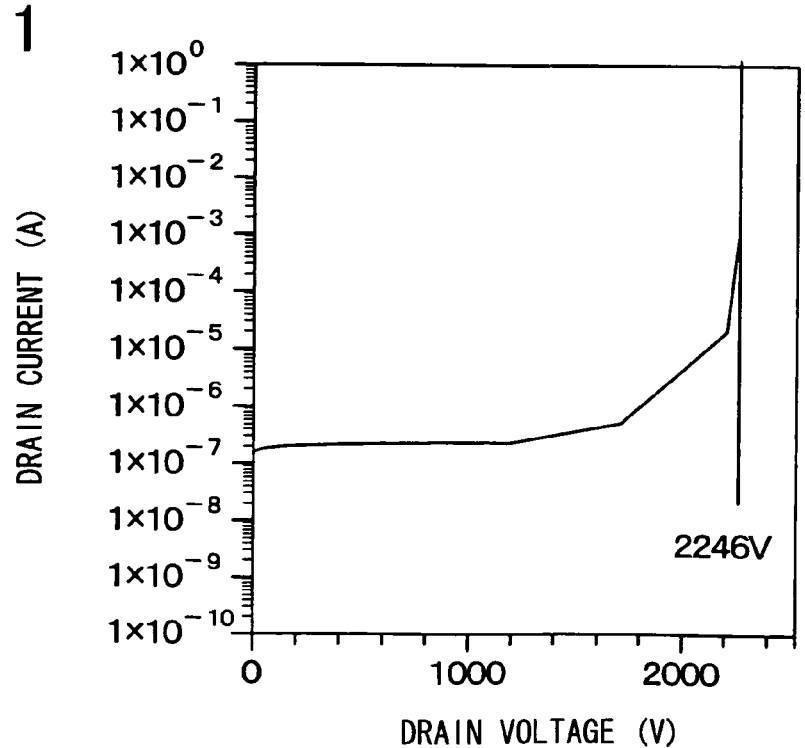
FIG. 11 is a view showing a drain voltage-drain current property in the JBS according to the simulation model 2.

The electrical field distribution in the JBS shown in FIGS. 6 and 9 and the equipotential distribution in the JBS shown in FIGS. 7 and 10 show that the electrical field and the equipotential lines just under the JBS, that is, in the drift layer 2 under the layers 8a to 8e, have flat properties regardless of the p-type impurity concentration of the layers 8a to 8e. This means that the highly pressure-proof property can be obtained even when the voltage or the current which exceeds the rating value is applied, that is, a case that a surge of the voltage or the current is occurred. The drain voltage-drain current property in the JBS shown in FIGS. 8 and 11 shows that the high breakdown voltage such as over 2000 volts can be obtained in both of the simulation models 1 and 2.

As mentioned above, each element are designed so that the charge quantities become equal, each element can be designed easily, the highly pressure-proof JBS can be obtained, and the resistivity of the layers 8a to 8e forming the PN diode can be lowered.

Second Embodiment

Figure 12:
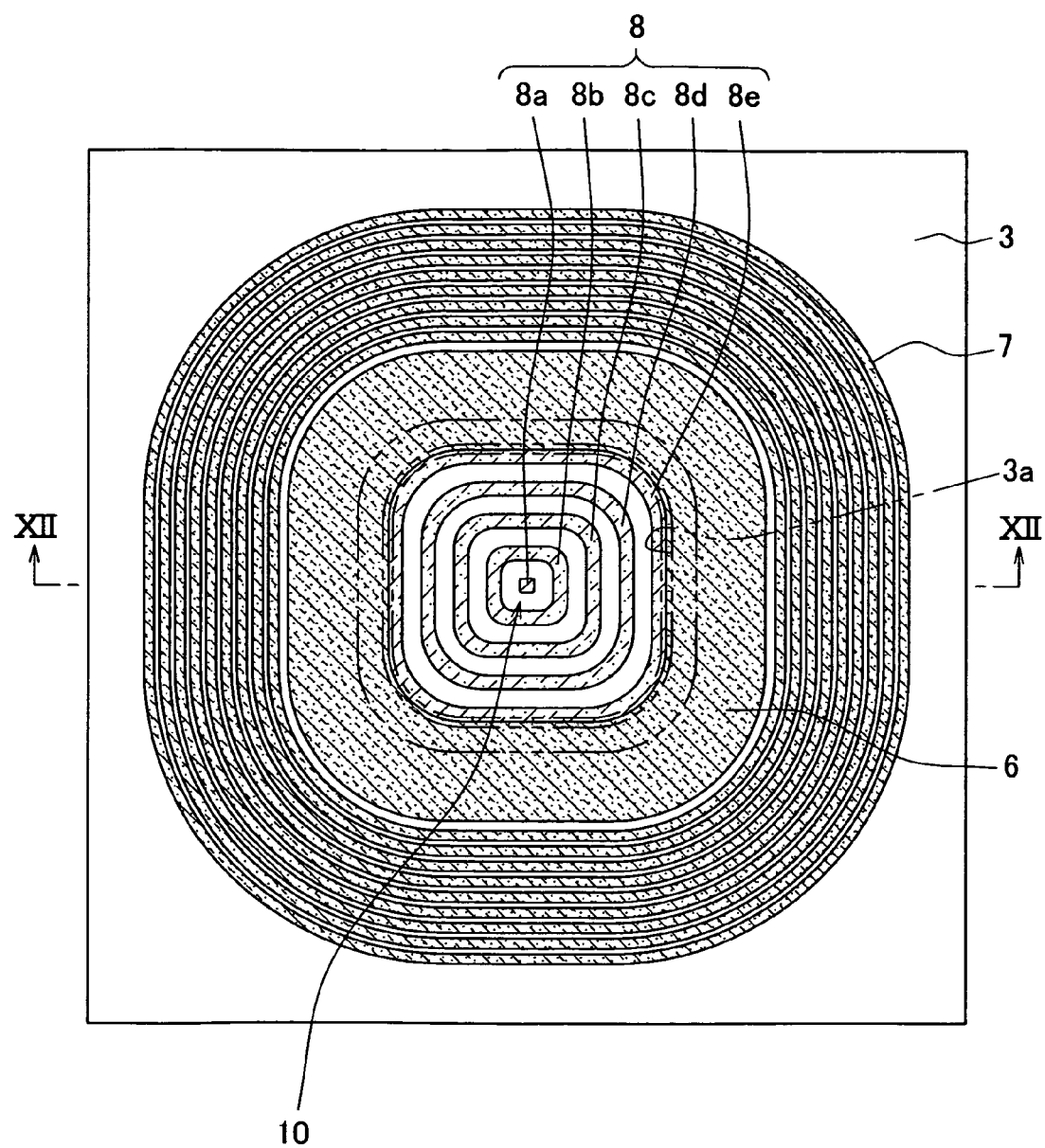
FIG. 12 is a cross sectional view showing a SiC semiconductor device taken along line XII-XII having a JBS according to a second embodiment.

The second embodiment will be described. FIG. 12 is a cross sectional view showing the SiC semiconductor device having a JBS according to the embodiment. The cross sectional view taken along the I-I is identical to FIG. 1. The SiC semiconductor device of the embodiment is the modification of the first embodiment, and the differences from the first embodiment are the JBS structure and the termination structure. Since other elements are same with the first embodiment, only the different portion will be described. Here, W2 is narrower than W1, and the ratio between W2 and W1 is 1.5/2.0, for example.

As shown in FIG. 12, in this embodiment, the p-type resurf layer 6 has a substantially square shape in which the corners of the edge portion inside the resurf layer 6 are rounded off. The p-type layers 8a to 8e also have substantially square shape in accordance with the shape of the resurf layer 6. In other words, the center portion 8a has substantially square shape in which the corners are rounded off and other layers 8b to 8e have substantially square frame shape so as to surround the center portion 8a. The same effect with the first embodiment can be obtained by this constitution.

Third Embodiment

Figure 13:
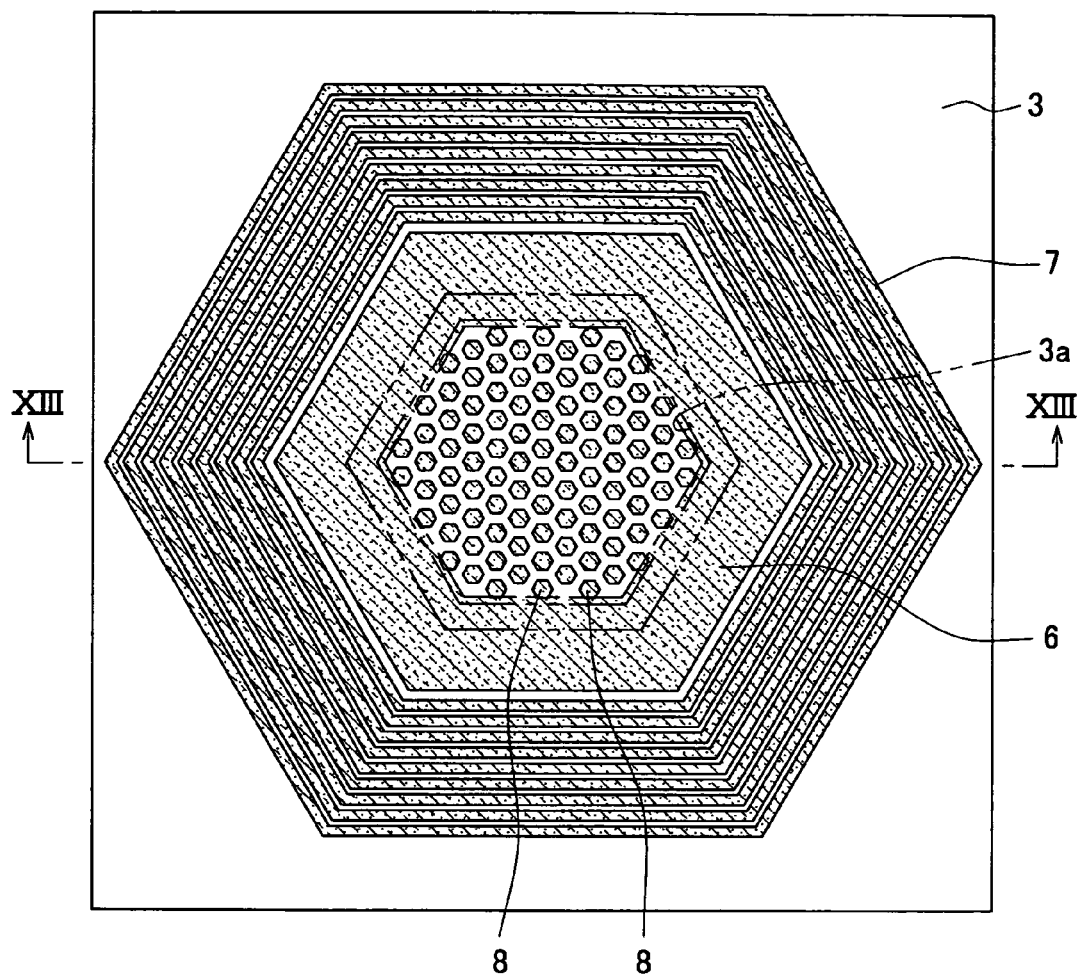
FIG. 13 is a cross sectional view showing a SiC semiconductor device taken along line XIII-XIII having a JBS according to a third embodiment.

The third embodiment will be described. FIG. 13 is a cross sectional view showing the SiC semiconductor device having a JBS according to the embodiment. The cross sectional view taken along line XIII-XIII is substantially identical to FIG. 1. The SiC semiconductor device of the embodiment is the modification of the first embodiment, and the differences from the first embodiment are the JBS structure and the termination structure. Since other elements are same with the first embodiment, only the different portion will be described. Here, W2 is narrower than W1, and the ratio between W2 and W1 is 1.5/2.0, for example.

As shown in FIG. 13, in this embodiment, the edge portion inside the resurf layer 6 is formed to have a hexagonal shape, and a plurality of p-type layers 8 having honeycomb shapes are arranged inside the resurf layer 6. Each of the layers 8 is same size and a width of a region between two adjacent layers 8, which is in the n$^-$-type drift layer 2, (the region surrounding each of the layers 8) is same. Each of the layers 8 are arranged so as to be point symmetrical with respect to the center of the schottky electrode 4. It is noted that only six layers 8 are arranged in the cross sectional view taken along line XIII-XIII, and the number of the layers 8 of the cross sectional view in FIG. 1 are different from that of this embodiment. However, the number of the layers 8 is just one example, the number of the layers 8 may be more or less than 6. The same effect with the first embodiment can be obtained by this constitution.

Fourth Embodiment

Figure 14:
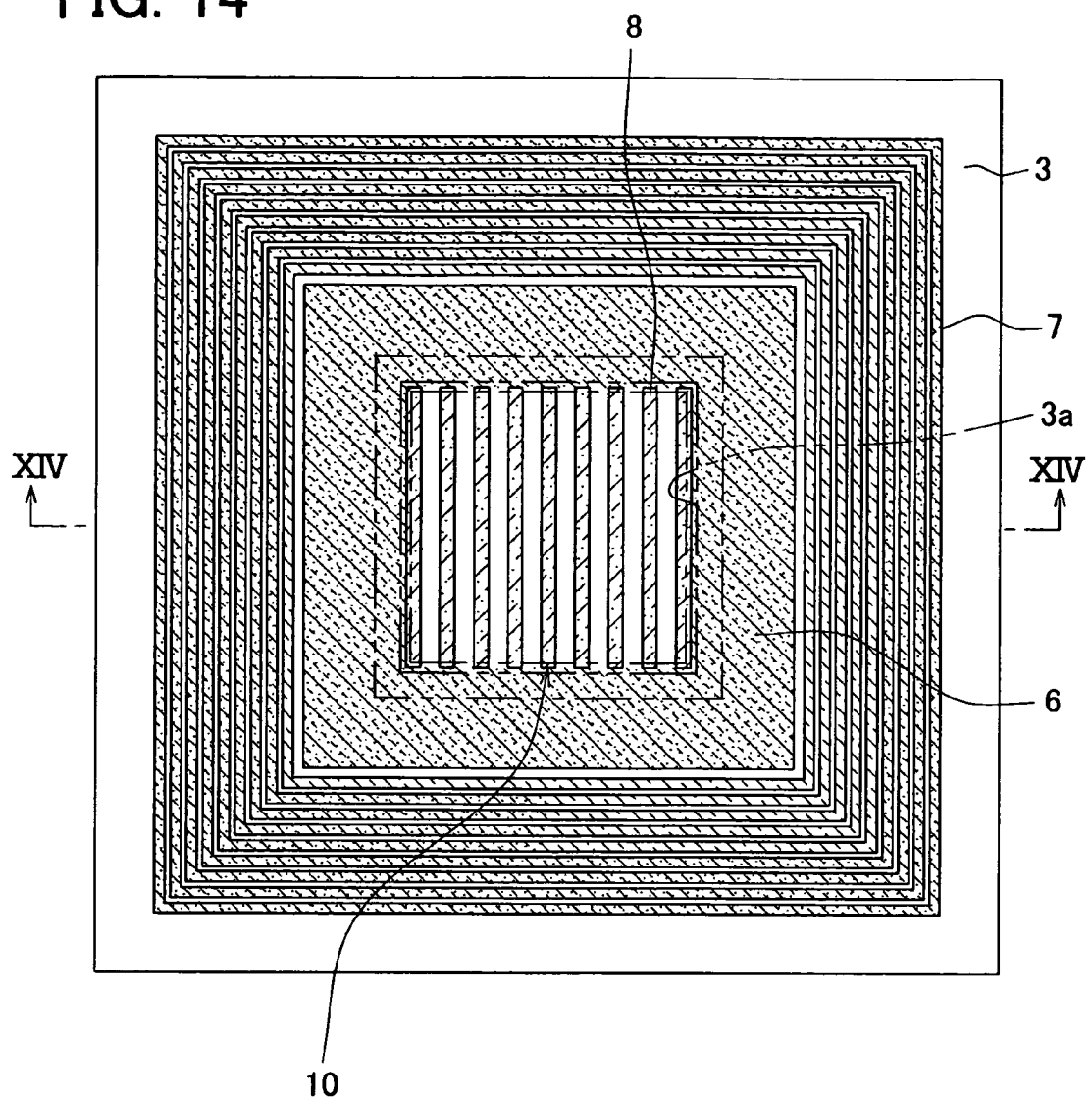
FIG. 14 is a cross sectional view showing a SiC semiconductor device taken along line XIV-XIV having a JBS according to a fourth embodiment.

The fourth embodiment will be described. FIG. 14 is a cross sectional view showing the SiC semiconductor device having a JBS according to the embodiment. The cross sectional view taken along line XIV-XIV is substantially identical to FIG. 1. The SiC semiconductor device of the embodiment is the modification of the second embodiment, and the differences from the second embodiment are the JBS structure and the termination structure. Since other elements are same with the second embodiment, only the different portion will be described. Here, W2 is narrower than W1, and the ratio between W2 and W1 is 1.5/2.0, for example.

As shown in FIG. 14, in this embodiment, the p-type layers 8 inside the resurf layer 6 are formed to have linear shapes extending along one direction, and a plurality of layers 8 are arranged in lines to have a stripe-shaped. Each of the layers 8 is same size and a width of a region between two adjacent layers 8, which is in the n$^-$-type drift layer 2, (the region surrounded by each of the layers 8) is same. Each of the layers 8 are arranged so as to be point symmetrical with respect to the center of the schottky electrode 4 (line symmetrical in case a centerline is drawn in the vertical direction of the paper). It is noted that although the shapes of the resurf layer 6 and the guard ring layers 7 are square-shaped in accordance with the shape of the layers 8, the corners thereof may be rounded off as shown in the second embodiment. The same effect with the first embodiment can be obtained by this constitution.

Other Embodiments

In each of the above embodiments, although one example of the number of the layers 8 is shown in FIGS. 12 to 14, the number of the layers 8 is not limited to this example. Moreover, in the second embodiment, although the square shape in which the corners are rounded off is taken for example as the shape of the edge portion inside the resurf layer 6 and the shape of the layers 8, a polygonal shape in which the other corner is rounded off may be used.

Furthermore, although the SiC semiconductor device in which the first conductivity type is n-type and the second conductivity type is p-type is shown, these conductivity types may be inverted.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A silicon carbide semiconductor device having a junction barrier schottky diode comprising:
   a substrate made of first conductive type silicon carbide, the substrate having a main surface and a rear surface;
   a drift layer made of the first conductive type silicon carbide disposed on the main surface of the substrate, an impurity concentration of the drift layer being lower than an impurity concentration of the substrate, wherein the drift layer includes a cell region;
   an insulating film having an opening portion disposed on the drift layer, the opening portion being disposed in the cell region;
   a plurality of second conductive type layers disposed in the cell region of the drift layer; and
   a schottky barrier diode having a schottky electrode and an ohmic electrode, the schottky electrode being disposed on the drift layer in the opening portion of the cell region and the ohmic electrode being disposed on the rear surface of the substrate, wherein
   the schottky electrode and a surface of the drift layer provide a schottky contact, the plurality of second conductive type layers are separated from each other and contact the schottky electrode,
   the plurality of second conductive type layers and the drift layer provides a PN diode, and
   a size and an impurity concentration of the plurality of second conductive type layers and a size and an impurity concentration of a portion of the drift layer sandwiched between the plurality of second conductive type layers are determined so that a charge quantity of the plurality of second conductive type layers is equal to a charge quantity of the portion.

2. The silicon carbide semiconductor device according to claim 1, wherein
   the impurity concentration of the plurality of second conductive type layers is higher than the impurity concentration of the portion of the drift layer.

3. The silicon carbide semiconductor device according to claim 1, wherein
   the cell region has a center, which defines a radial direction with respect to the center,
   each of the plurality of second conductive type layers has a width along with the radial direction,
   the width of each of second conductive type layers is narrower than a distance between adjacent two second conductive type layers along with the radial direction.

4. The silicon carbide semiconductor device according to claim 1, wherein
   the cell region has a center, which defines a radial direction with respect to the center,
   the plurality of second conductive type layers includes a center portion which locates at the center of the cell region and a plurality of circular portions which are arranged so as to surround the center portion and to be point symmetrically with the center portion,
   the plurality of circular portions includes a most outer circular portion and a plurality of inner circular portions,
   a cross section of the plurality of inner circular portions along with the radial direction provides symmetry between the center portion and the most outer circular portion.

5. The silicon carbide semiconductor device according to claim 4, wherein
   the plurality of circular portions are arranged concentrically with the center portion.

6. The silicon carbide semiconductor device according to claim 4, wherein
   the center portion has a polygonal shape with rounded corners, and
   each of the plurality of circular portions has a polygonal shape with rounded corners.

7. The silicon carbide semiconductor device according to claim 4, wherein the drift layer further includes a termination region, which surrounds the cell region, the termination region includes a resurf layer having the second conducting type, the most outer circular portion contacts the resurf layer or is integrated with the resurf layer.

* * * * *